United States Patent [19]

Koch

[11] Patent Number: 5,032,803
[45] Date of Patent: Jul. 16, 1991

[54] DIRECTIONAL STRIPLINE STRUCTURE AND MANUFACTURE

[75] Inventor: Michael J. Koch, Alachua, Fla.

[73] Assignee: American Telephone & Telegraph Company, New York, N.Y.

[21] Appl. No.: 474,563

[22] Filed: Feb. 2, 1990

[51] Int. Cl.⁵ .................. H01P 5/18; H05K 3/20
[52] U.S. Cl. .................. 333/116; 29/830; 29/831; 361/414
[58] Field of Search .......... 29/830, 831; 333/116, 333/238; 361/414, 424; 428/901

[56] References Cited

U.S. PATENT DOCUMENTS

| | | | |
|---|---|---|---|
| 3,568,000 | 3/1971 | D'Aboville et al. | 333/238 X |
| 4,494,083 | 1/1985 | Josefsson et al. | 333/238 X |
| 4,812,792 | 3/1989 | Leibowitz | 333/238 |
| 4,821,007 | 4/1989 | Fields et al. | 29/830 X |
| 4,823,097 | 4/1989 | Konishi et al. | 333/116 |
| 4,864,722 | 9/1989 | Lazzarini et al. | 29/830 |

OTHER PUBLICATIONS

IEEE Transactions on Microwave Theory and Techniques, vol. 36, No. 6, Jun. 1988, pp. 1057-1063, by Konishi et al.
"Characteristic Impedances of Broadside-Coupled Strip Transmission Lines," by S. B. Cohn, Trans. IRE, vol. PGM TT-8, 6, pp. 633-637 (Nov. 1960).

Primary Examiner—Carl J. Arbes

[57] ABSTRACT

This disclosure describes a double-sided transmission substrate formed with striplines and end-ports in juxtaposition on either side. The transmission substrate is sandwiched between two exterior dielectric substrates, each coated on one side with a metallic layer. The three substrates are laminated together. Through-holes are drilled into the lamination and its interior substrate, at known locations to intersect the said ports. The copper exteriors of each board are etched to identify two contact pad lands on each side. Plated-thru holes are created to connect to each of the ports.

10 Claims, 4 Drawing Sheets

DIRECTIONAL STRIPLINE STRUCTURE AND MANUFACTURE

FIELD OF THE INVENTION

This invention relates to stripline directional couplers, and more particularly to a coupler structure and manufacturing technique which is relatively inexpensive and yet produces devices with extremely uniform electrical and mechanical characteristics.

BACKGROUND OF THE INVENTION

A stripline coupler consists typically of a pair of shaped and juxtaposed planar transmission line conductors located between two ground planes. This structure shields the conductors from the electrical influences of adjacent components and helps to contain the electromagnetic fields to the area within the two ground planes. Since the circuit is fabricated with the transmission line conductors contained within and necessarily separated from the two ground planes, provision must be made to connect external components or circuit paths to the internal transmission lines.

Making this connection effectively between the stripline directional couplers and its mother-board in the prior art devices has been one of the factors contributing to a relatively high cost of the devices. Typically, stripline directional couplers have been fabricated by mechanically securing an assembly of multiple boards with stripline paths thereon. Lamination is not typically employed. Drilled hole openings in the outer layers provide a means for effectively allowing soldering to the inner transmission lines. The process is labor-intensive.

The method traditionally used for connecting to the inner striplines is not as reliable as needed and, further, is not cost-effective. However, unit cost reductions are difficult to achieve while at the same time retaining uniform coupling characteristics and a high degree of isolation between certain ones of the ports. Isolation in this context is the ratio of the power of the input to a given port to the power at the isolated port. Isolation is a measure of any unevenness in the substrate or variation in the spacing of the ground planes.

Mounting of these devices to mother-boards with highly reliable, easy-to-effect solder steps, while at the same time conserving on the limited mother-board mounting area, is also desirable, but hard to achieve because of the requirement to fit increasingly larger numbers of components onto mother-boards.

The prior art supplies many techniques for making stripline directional couplers and for effecting exterior connections to the interior striplines. U.S. Pat. No. 4,821,007, issued Apr. 11, 1989, teaches the plating of holes routed through an insulating circuit board and through the interior stripline transmission path. The plated holes then are bisected by cutting the board along a line that passes through each plated hole. The cut forms a semi-cylindrical plated indentation where the cut bisects each hole. These exposed plated surfaces are on the edge of the stripline and, accordingly, can be used as electrical contacts for bead-soldering to a mother-board. Further, since the plated indentation extends to both sides of the cut board, the resulting component can be soldered to the mother-board from either of its sides. While advantage is thus gained from the teaching of 4,821,007 to forming contact pads, the approach has the disadvantage of having to bisect each contact hole which, as noted, may stress the plated area and lead to unreliable connections as well as inefficient use of limited available mounting area.

OBJECTS OF THE INVNEITON

One object of the inventions is to create a stripline directional coupler which is inexpensive to make and to install and which exhibits low insertion loss and uniform coupling characteristics.

A further object of the invention is to provide such a coupler that can be readily solder-connected to a mother-board and which consumes relatively little "real estate."

A further object of the invention is to provide a method for manufacturing large quantities of couplers which meet the preceding objects and, when installed, are also highly niform in their electrical and mechanical characteristics.

SUMMARY OF THE INVENTION

A stripline directional coupler formed pursuant to the instant invention, comprises a multilayered printed wiring board in which the interior transmission paths are etched on opposite sides of a double-side board. The patterned circuit is bonded to outer substrates, each consisting of a single-sided copper-plated board, wherein the inner layer is etched bare and the outer layer is solid copper. The assembly is then drilled, plated, and etched using low-cost conventional technology. Connections to the stripline are made with plated through-holes connecting an exterior connection pad to the inner strip. The entire assembly can be then soldered in an upright position onto another board, saving valuable board space. Advantageously, the board substrates are formed polytetrafluoroethylene reinforced with woven glass. The invention's processes can be applied to the concurrent fabrication of multiple stripline directional couplers. Specific embodiments of stripline directional couplers, which are particularly inexpensive to manufacture, are provided.

DETAILED DESCRIPTION OF AN ILLUSTRATIVE EMBODIMENT

The invention is illustrated in relation to the fabrication of a so-called broadside-coupled stripline of the type described in the article, "Characteristic Impedances of Broadside-Coupled Strip Transmission Lines," by S. B. Cohn, appearing in the Trans. IRE, Vol. PG MTT-8,6, pp. 633–637 (Nov. 1960). This article is hereby incorporated by reference to the extent relevant. However, the invention will be recognized by practitioners skilled in the art to be applicable to other types of microstrip or stripline devices and their fabrication.

Figure 1:
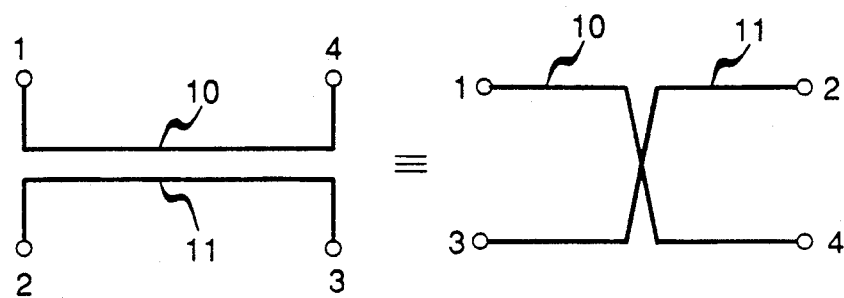
FIG. 1 is a diagram of an equivalent electrical circuit of a stripline device.
Figure 2:
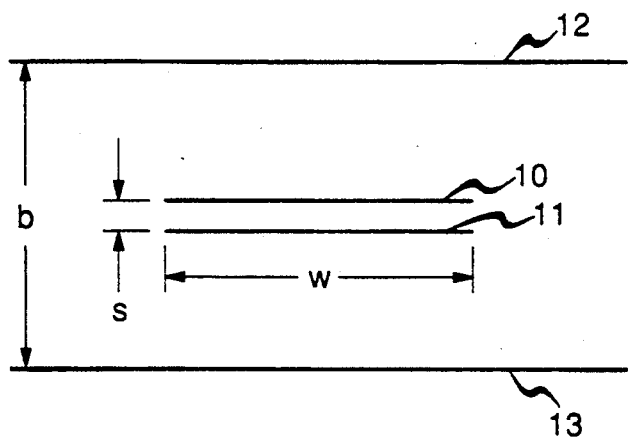
FIG. 2 is a diagram illustrating a stripline structure showing certain critical structural parameters.

By way of background, as seen in FIG. 1, a directional coupler may be represented in electrical configuration by two striplines, one denoted 10 having ports 1 and 4, and the other denoted 11 having ports 2 and 3. Placing these two striplines in controlled close physical proximity to one another creates a predetermined and desired electrical coupling. The diagrams depicted in FIG. 1 are electrically equivalent. By following the design precepts contained, for example, in the noted teaching of Cohn, couplers having any desired coupling coefficient are created. A coupler may comprise a structure such as is illustrated in FIG. 2. There, the dimension b is the distance between exterior ground planes 12 and 13. The dimension s is the distance between the two striplines 10 and 11; and the dismension w is the width of the striplines. The parallel strips 10 and 11 are made equal to one-quarter wavelength at the center frequency of intended operation of the device. The dimensions b,s, and w are parameters of a stripline according to the teaching of the referenced text of Cohn; and along with the dielectric constant of the board material, determine the electrical characteristics of the striplines.

Figure 3:
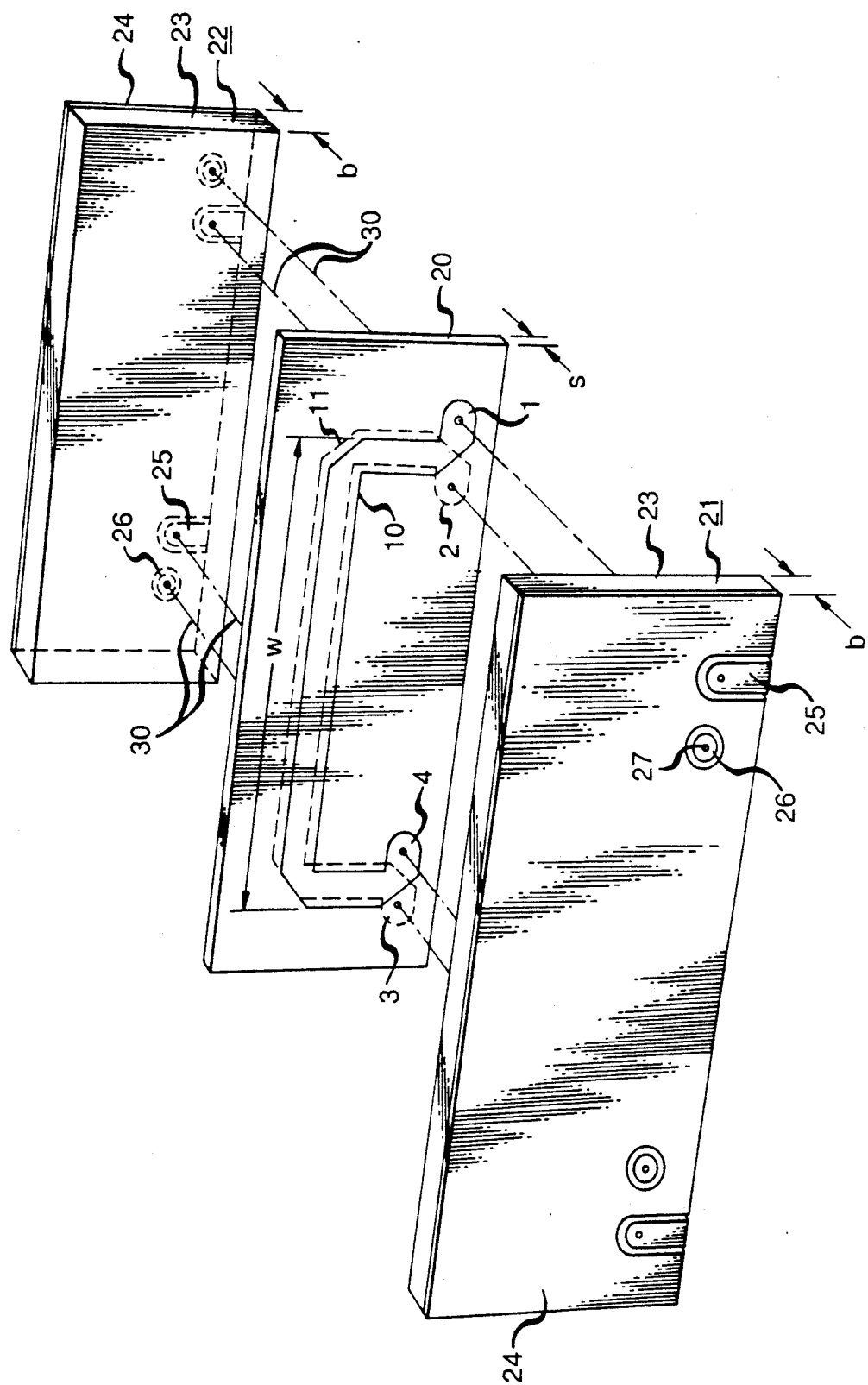
FIG. 3 is a prerspective view of a stripline multi-layer printed wiring board assembly.

FIG. 3 illustrates how striplines can be fabricated pursuant to the invention. A double-sided transmission substrate 20 is formed with the striplines 10 and 11 etched thereon in conventional fashion. Substrate 20 advantageously is made of a woven glass-reinforced polytetrafluoroethylene composite. Such material is available, for example, from Rogers Corporation of Chandler, AZ. Another suitable example of board material is woven TEFLON ® glass. These materials are advantageous choices for many striplines, because they are electrically suitable and can be easily laminated. Other substrate materials are usable also, such as a ceramic or quartz. If a TEFLON ® material is selected, it is available with material dielectric constants of from 2.0 to more than 10.0. By selecting a TEFLON ® material with a dielectric constant of, for example, 2.5, and a coupling value of 3bB, the values of s, b, and w substantially are: $s=0.01''$, $b=0.1''$, and $w=0.04''$.

Substrate 20 is formed with desired circuit paths, but not with through-holes. Substrates 21 and 22 each consist of a dielectric board 23 coated on one side with a layer of copper 24. The substrates 20, 21 and 22 are laminated together. The lamination prcess can advantageously include placing a sheet of heat-sensitive adherent material (not shown) between each of the opposing substrates. Heat then is applied.

At this point the assembly of the substrates 20,21, and 22 are drilled through at points denoted by the axes 30 in FIG. 3. The drilled hole interiors are then plated to create plated-through holes 27. Following this, the copper layers 24 of each board 23 are etched to identify two contact pad lands 25 and two land areas 26 on each side of board 23. Plated-through holes 27 serve the purpose of connecting each of the ports 1-4, to the pads 25 and also to the land areas 26.

Figure 4:
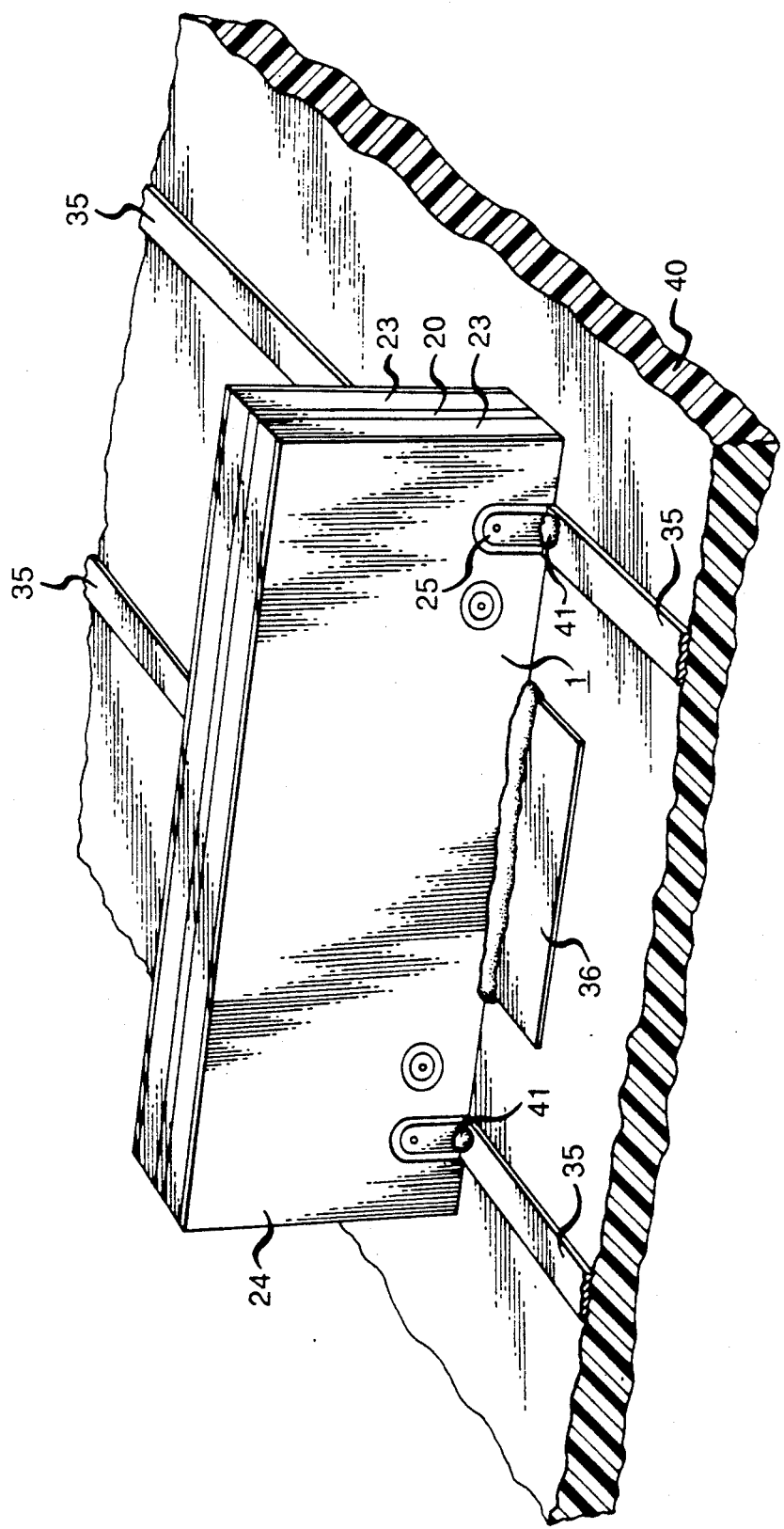
FIG. 4 is a schematic perspective view of the devices of FIG. 1 mounted vertically on a carrier board.

FIG. 4 shows a completed stripline directional coupler, denoted 1, and consisting of the components already described in connection with FIG. 3, soldered in an upright position onto a mother-board 40. Solder beads 41 secure the pad lands 25 to exemplary circuit paths 35. Ground plane 24 of substrate 23 is soldered to a ground land area 36 of board 40. The resulting vertical mounting of coupler 1 to board 40 is strong and yet requires relatively little board area. In the way illustrated, several couplers may be so mounted in upright positions on board 40.

Figure 5:
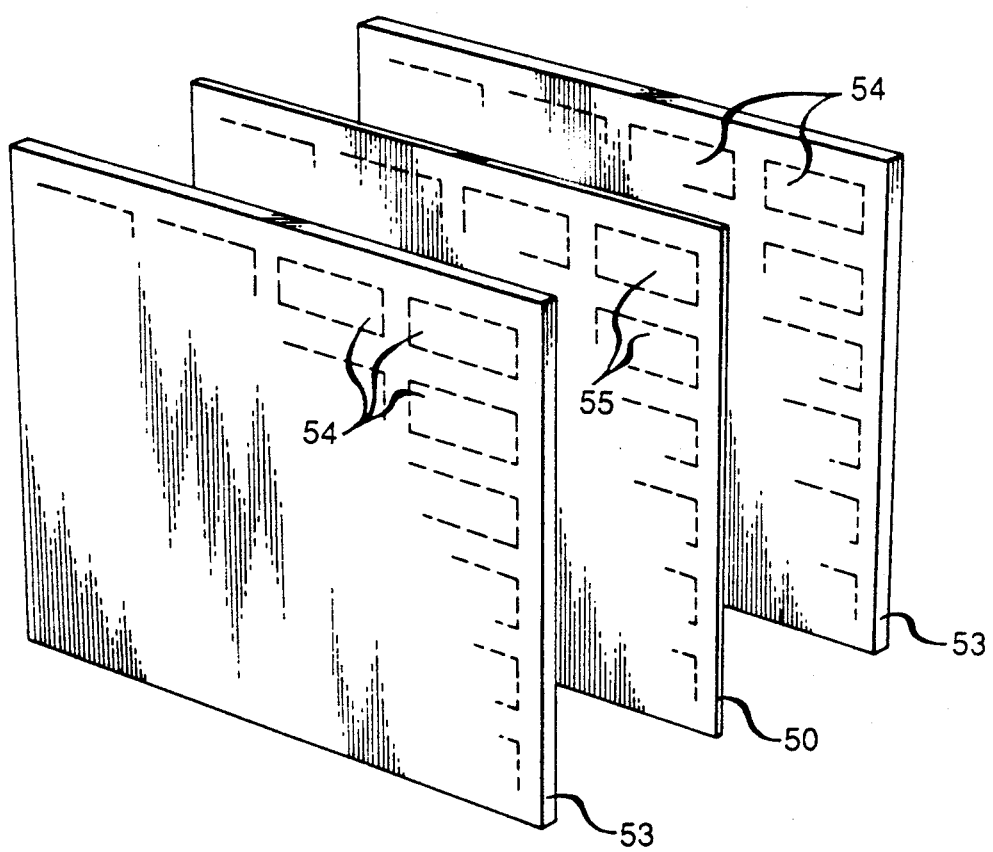
FIG. 5 is a sketch illustrating the use of the process in making a multiplicity of directional couplers in a production operation.

FIG. 5 illustrates how several striplines may be produced in the same series of steps as defined above, by forming multiple stripline components in the same process steps. The substrates 50 and 53 correspond to substrates 20 and 23 of FIG. 3. Thus, several ground plane regions, generally denoted 54, are formed on the substrates 53 by the processes already described with respect to FIG. 3. Similarly, pad areas such as 25 in FIG. 3 and any other metallized areas such as area 26 are formed in regions 54. On substrate 20, in the regions denoted 55, striplines of the type described as elements 10 and 11 in FIG. 3 are formed on both sides. The inner substrate 50 and the two outer substrates 53, with needed metallized layers and plated-through holes, or "vias" are formed as described. The couplers which are now formed in each of the regions 54 and 55 are extracted from the laminated assembly by, for example, conventional sawing-out or milling of the regions 54. In this process of extracting the fully formed couplers from the multi-component lamination, the critical circuit paths and vias are not subject to damage from the cutting.

I claim:

1. A method for fabricating directional couplers comprising a pair of spaced striplines, comprising the steps of: forming first and second metallic striplines on opposite sides of an interior insulative substrate, each said stripline having a first and a second port disposed substantially adjacent to a selected edge of said substrate;

forming first and second external substrates each comprising an insulative board with one side thereof metallically coated;

laminating said external substrates to respective sides of said interior substrate, with the location of said ports being in a known and predetermined planar coordinate relationship with respect to access points on the metallic surfaces of said external substrates;

forming holes through said laminated assembly at said access points;

metallically plating through said holes, thereby to effect electrical connection between said respective ones of said plated holes and the corresponding one of said ports of said interior substrate; and etching a region around the plated through-hole entrance at each access point to form a metal pad extending from said entrance to said edge of said substrate to electrically isolate said hole entrance from the surrounding metallic coating.

2. The directional coupler produced substantially by the method of claim 1.

3. The method for fabricating directional couplers according to claim 1, wherein the material of said interior and said two exterior substrates is polytetrafluoroethylene reinforced with woven glass.

4. The directional coupler produced substantially by the method of claim 3.

5. The method for fabricating directional couplers according to claim 3, wherein said substrate material has a dielectric constant in the range of from 2.0 to substantially 10.0.

6. The directional coupler produced substantially by the method of claim 5.

7. The product of claim 6, wherein the dielectric constant of said substrate material is substantially 2.5, and wherein the critical dimensions denoted s, b, and w as defined in the specification are: $s=0.01''$; and $w=0.04''$.

8. The method according to claims 1,3, or 5, comprising the further steps of placing a sheet of heat-actuated adherent material between the internal substrate and each of said two external substrates, bringing all said substrates together, and applying heat.

9. A method for manufacturing a circuit board comprising one or more directional couplers, comprising the steps of:

forming first and second metallic striplines on opposite side of an interior insulative substrate, each said stripline having a first and a second port;

forming first and second external substrates each comprising an insulative board with one side thereof metallically coated;

laminating said exteranl substrates to respective sides of said interior substrate, with the location of said ports being in a known and predetermined planar coordinate relationship with respect to access points on the metallic surfaces of said external substrats;

forming holes through said laminated assembly at said access points; metallically plating through said holes, thereby to effect electrical connection between said respective ones of said plated holes and the corresponding one of said ports of said interior substrate;

etching a region around the plated through-hole entrance at each access point to electrically isolate said hole entrance from the surrounding metallic coating, thereby to create along an edge of said exterior substrates a connection pad for each said plated through-hole; and vertically affixing the resulting said directional coupler to a mother-board comprising ground metallic regions and circuit paths, by solder connections of said coupler pads to said circuit paths on said mother-board and by solder connection of said ground planes of said exterior substrates to said metallic regions of said motherboard.

10. The product produced by the process of claim 9.

* * * * *